(12) United States Patent
Fujita et al.

(10) Patent No.: US 7,906,901 B2
(45) Date of Patent: Mar. 15, 2011

(54) ORGANIC ELECTROLUMINESCENT DEVICE AND ORGANIC ELECTROLUMINESCENT DISPLAY DEVICE

(75) Inventors: Yoshimasa Fujita, Kashihara (JP); Yumiko Saeki, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 289 days.

(21) Appl. No.: 12/279,082

(22) PCT Filed: Oct. 27, 2006

(86) PCT No.: PCT/JP2006/321533
§ 371 (c)(1),
(2), (4) Date: Aug. 12, 2008

(87) PCT Pub. No.: WO2007/094101
PCT Pub. Date: Aug. 23, 2007

(65) Prior Publication Data
US 2009/0200923 A1      Aug. 13, 2009

(30) Foreign Application Priority Data

Feb. 14, 2006   (JP) ................ 2006-037020

(51) Int. Cl.
*H05B 33/00*   (2006.01)
(52) U.S. Cl. ........................ 313/504; 313/506
(58) Field of Classification Search .......... None
See application file for complete search history.

(56) References Cited

U.S. PATENT DOCUMENTS

| | | | |
|---|---|---|---|
| 5,742,129 A | 4/1998 | Nagayama et al. | |
| 7,494,721 B2 * | 2/2009 | Ikeda et al. | 428/690 |
| 7,504,163 B2 * | 3/2009 | Jarikov | 428/690 |
| 2001/0006742 A1 | 7/2001 | Morioka et al. | |
| 2005/0084710 A1 | 4/2005 | Kishino et al. | |
| 2008/0197768 A1 * | 8/2008 | Conway et al. | 313/504 |
| 2008/0265751 A1 * | 10/2008 | Smith et al. | 313/504 |

FOREIGN PATENT DOCUMENTS

| | | |
|---|---|---|
| EP | 0 851 714 A2 | 7/1998 |
| JP | 10-012377 A | 1/1998 |
| JP | 2003-100462 A | 4/2003 |
| JP | 2004-220830 A | 8/2004 |
| WO | 95/31515 A1 | 11/1995 |
| WO | 97/40648 A1 | 10/1997 |

OTHER PUBLICATIONS

Official Communication issued in International Patent Application No. PCT/JP2006/321533, mailed on Dec. 19, 2006.
Cao et al., "Ultrathin Layer Alkaline Earth Metals as Stable Electron-Injecting Electrodes for Polymer Light Emitting Diodes," Journal of Applied Physics, Sep. 15, 2000, vol. 88 No. 6, pp. 3618-3623.

* cited by examiner

*Primary Examiner* — Ashok Patel
(74) *Attorney, Agent, or Firm* — Keating & Bennett, LLP

(57) ABSTRACT

An organic EL device having excellent light-emitting properties, particularly a long lifetime, by controlling a balance between a hole and an electron, which is required for light-emitting in the organic EL device, includes a structure in which an anode, an organic layer including a light-emitting layer, and a cathode are stacked on a substrate in this order, wherein the light-emitting layer includes two or more different light-emitting materials, and a difference in photoluminescence peak wavelength between the two or more different light-emitting materials is about 50 nm or less.

4 Claims, 3 Drawing Sheets

ORGANIC ELECTROLUMINESCENT DEVICE AND ORGANIC ELECTROLUMINESCENT DISPLAY DEVICE

BACKGROUND OF THE INVENTION

1. Field of the Invention

The present invention relates to an organic electroluminescent device and an organic electroluminescent display device. More particularly it relates to an organic electroluminescent device which is suitable as a light-emitting element in a display device such as an organic electroluminescent display device and the like, and an organic electroluminescent display device.

2. Description of the Related Art

In recent years, in association with advanced information, needs for low-profile, low power consumption and light-weight flat-panel displays (FPD) are increasing. Particularly, organic electroluminescent display devices (hereinafter, also referred to as a "organic EL display"), which can be driven at a low voltage and can realize the display with high luminance attracts attention. Particularly, the luminous efficiency of an organic electroluminescent device (hereinafter, also referred to as a "organic EL device") using organic light-emitting materials as a light-emitting element is significantly improved by recent research and development, and commercialization of the organic EL display including such an EL device are starting.

As the light-emitting material used for the organic EL device, generally, small molecular light-emitting materials or high molecular light-emitting polymer material, which comprises organic compounds and/or organic metal compounds. The common organic EL device using light-emitting polymer materials has, for example, a constitution in which an anode made of indium tin oxide (ITO) or the like, a hole transport layer (PEDOT-PSS (poly(ethylenedioxythiophene)/poly(styrene sulfonate)), a light-emitting layer formed containing the light-emitting polymer material, and a cathode made of Ca/Al are formed on a glass substrate in turn. It has been reported that the organic EL device having such a constitution has relatively excellent luminance, luminous efficiency (power consumption) and lifetime. However, common organic EL devices are not adequate as far as the luminance, the luminous efficiency (power consumption) and particularly the lifetime in consideration of the application range to actual commodity products, and their application is limited.

Thus, in order to improve the characteristics, particularly, the luminance, the luminous efficiency and the lifetime, of the organic EL device, various measures are hitherto studied. For example, technology of improving the light-emitting material itself (for example, Patent Document 1), and technology for improving the cathode (for example, Non-patent Document 1) are proposed. However, in order to attain a practical organic EL device having wide applications, the above-mentioned measures were inadequate. For example, the organic EL display device is extremely inferior in power consumption and lifetime to the FPD using a liquid crystal display panel even when the above-mentioned measures are taken.

On the other hand, technology of blending a polymer containing at least two emissive polymers in a polymer film (light-emitting layer) is disclosed (for example, Patent Document 2). However, this technology is a method of obtaining different colors by controlling a voltage and is not a method of improving the luminance, the luminous efficiency and the lifetime of the organic EL device.

Patent Document 1: National Publication of International Patent Application No. H11-508731

Patent Document 2: National Publication of International Patent Application No. H10-500441

Non-patent Document 1: Y. Cao, Gang Yu, I. Parker and J. Heeger, "Ultrathin Layer Alkaline Earth Metals As Stable Electron-Injecting Electrodes For Polymer Light Emitting Diodes", Journal of Applied Physics, (USA), 2000, Vol. 88, p. 3618

SUMMARY OF THE INVENTION

In order to overcome the problems described above, preferred embodiments of the present invention provide an organic EL device having excellent light-emitting properties, particularly a long lifetime, by controlling a balance between a hole and an electron, which is required for light-emitting in the organic EL device.

The present inventors made intensive investigations in accordance with their firm beliefs that it is necessary to perform research and development for a device with higher efficiency and technically investigate a mechanism of light emission and degradation deeply in order to significantly improve light-emitting properties such as the luminance and the lifetime of the organic EL device, and consequently found the new fact that a driving voltage, luminous efficiency and a lifetime of the organic EL device largely depends on a balance of charges (hole and electron) of the light-emitting layer particularly in the organic EL device using light-emitting polymer materials (hereinafter, also referred to as a "polymer type organic EL device"), and found that not only the lifetime of the polymer type organic EL device but also the lifetime of the organic EL device in general can be significantly improved by the fact that the light-emitting layer contains two or more different light-emitting materials and a difference in photoluminescence peak wavelength between the two or more different light-emitting materials is about 50 nm or less. They conceived of finding that these discoveries can solve the above-described problems and have now led to completion of preferred embodiments of the present invention.

That is, a preferred embodiment of the present invention pertains to an organic electroluminescent device including a structure in which an anode, an organic layer including a light-emitting layer, and a cathode are stacked on a substrate in this order, wherein the light-emitting layer includes two or more different light-emitting materials, and a difference in photoluminescence peak wavelength between the two or more different light-emitting materials is about 50 nm or less.

Hereinafter, preferred embodiments of the present invention will be described in detail.

The organic EL device according to a preferred embodiment of the present invention has a structure in which an anode, an organic layer including a light-emitting layer, and a cathode are stacked on a substrate in this order. The light-emitting layer is a layer containing light-emitting materials. The organic layer is a layer containing organic materials and is located between the anode and the cathode. Further, the organic layer may have a single layer structure or may have a layered structure, but it preferably has the layered structure, and more specifically it preferably includes a hole injection layer, a hole transport layer, an electron injection layer, and an electron transport layer in addition to the light-emitting layer. Thereby, the luminous efficiency of the organic EL device is improved. In addition, the organic EL device according to a preferred embodiment of the present invention may have a structure in which the anode, the organic layer including the light-emitting layer, and the cathode are stacked on the substrate in this order from the substrate side, or may have a structure in which the cathode, the organic layer including the light-emitting layer, and the anode are stacked on the substrate in this order from the substrate side.

The light-emitting layer preferably includes two or more different light-emitting materials. Each light-emitting material transports the hole or the electron. In addition, the phrase the light-emitting layer preferably includes two or more different light-emitting materials means that two or more different light-emitting materials are present in a mixed state within the same light-emitting layer. The two or more different light-emitting materials may be mixed substantially uniformly or non-uniformly within the same light-emitting layer, but preferably, the light-emitting materials are mixed uniformly from the viewpoint of improving luminous efficiency. The light-emitting material is not particularly limited as long as it is a substance to emit visible light by applying an electric field, but small molecular light-emitting materials and light-emitting polymer materials including organic compounds and/or organic metal compounds are suitable. The two or more different light-emitting materials according to a preferred embodiment of the present invention emit light together within the same light-emitting layer, and therefore a relationship between the two or more different light-emitting materials is distinguished from a relationship between the so-called host material and dopant material. In addition, proportions of the respective light-emitting materials in the light-emitting layer are not particularly limited, and they may be appropriately set, but a proportion (mol %) of each light-emitting material with respect to all light-emitting materials in one light-emitting layer is preferably about 20 mol % to about 80 mol % particularly from the viewpoint of effectively achieving the extension of the lifetime. Further, the light-emitting layer may be a single layer or may have a multilayer structure formed by stacking a plurality of layers. Furthermore, when the light-emitting layer is the multilayer structure, at least one light-emitting layer may include two or more different light-emitting materials and have a peak wavelength described later, but it is preferable that all light-emitting layers include two or more different light-emitting materials and have a peak wavelength described later, respectively, from the viewpoint of more effectively realizing the extension of the lifetime.

The difference in photoluminescence peak wavelengths between the two or more different light-emitting materials preferably is about 50 nm or less, preferably about 20 nm or less, more preferably about 10 nm or less, and furthermore preferably about 5 nm or less. Thereby, it becomes possible to extend the lifetime of the organic EL device. A peak wavelength in photoluminescence (hereinafter, also referred to as a "luminance peak wavelength") is a luminance peak wavelength in a visible light region in measuring photoluminescence of each light-emitting material alone, and the light-emitting layer including each light-emitting material may have a luminance peak wavelength which is different from a luminance peak wavelength of each light-emitting material alone. Further, a difference in photoluminescence peak wavelength between the two or more different light-emitting materials is about 50 nm or less means that a difference between luminance peak wavelengths of all light-emitting materials included in one light-emitting layer is about 50 nm or less. That is, one light-emitting layer may include any number of different light-emitting materials as long as a difference in luminance peak wavelengths is 50 nm or less, but on the other hand, one light-emitting layer does not contain the light-emitting materials between which a difference in luminance peak wavelengths is more than about 50 nm. Furthermore, when any or all of two or more different light-emitting materials have two or more photoluminescence peaks (hereinafter, also referred to as a "luminance peak") per each light-emitting material, if a difference between at least one luminance peak wavelength of one light-emitting material and at least one luminance peak wavelength of another light-emitting material is about 50 nm or less, the light-emitting layer may include these light-emitting materials. However, it is preferable that a difference between all luminance peak wavelengths of one light-emitting material and all luminance peak wavelengths of another light-emitting material is about 50 nm or less in order to extend the lifetime of the organic EL device more. A lower limit of the difference in the luminance peak wavelengths is not particularly limited, and even when the difference is 0 nm, the effects and advantages of preferred embodiments of the present invention can be achieved, but the difference is preferably about 1 nm or more in order to exhibit more greatly the effects and advantages of preferred embodiments of the present invention. That is, it is preferable that the difference in photoluminescence peak wavelength between the two or more different light-emitting materials is about 1 nm or more. A luminance peak wavelength can be measured by a conventional measuring method of photoluminescence. For example, a sample in which each layer is formed independently from two or more different light-emitting materials on a quartz substrate can be measured at room temperature (25° C.) with a commercially available measuring apparatus. Examples of the measuring apparatus include MCPD-3000 (manufactured by Otsuka Electronics Co., Ltd.).

Here, the relationship between the difference in photoluminescence peak wavelength between the two or more different light-emitting materials and the effects and advantages of preferred embodiments of the present invention will be described.

In the organic EL device according to a preferred embodiment of the present invention, by decreasing the difference in the luminance peak wavelength of the respective light-emitting material, that is, by decreasing the difference between energy required for light emission of the respective light-emitting materials, it becomes possible to use excitation energy produced by recombination of the electron and the hole in the respective light-emitting materials for the same light emission. Accordingly, damages due to charges and excitation can be widely dispersed in the light-emitting materials, and therefore the lifetime of the organic EL device can be improved. On the other hand, when only light emission from one light-emitting material is obtained, damages are concentrated on only the material emitting light to accelerate degradation. An upper limit of a range of a difference in luminance peak wavelength in which the effects and advantages of preferred embodiments of the present invention like this is obtained is about 50 nm, and if the difference in luminance peak wavelength of the respective light-emitting materials is more than about 50 nm, the respective light-emitting materials emit light simultaneously as a color source disclosed in, for example, National Publication of International Patent Application No. H10-500441, and therefore each light emission causes the degradation of each light-emitting material and there is no improvement in the lifetime of the organic EL device. Further, in the above-mentioned color source, since the different light-emitting materials having different lifetime characteristics were mixed, changes in the emission spectrum occur due to aging and color purity of the organic EL device varies. Furthermore, because there is a tendency that excitation energy shifts to light emission of lower energy, or light emission of longer wavelength, when the difference in luminance peak wavelength is more than about 50 nm, the excitation energy is concentrated on only the light-emitting material emitting light at lowest energy of the light-emitting materials. Then, a problem that by the concentrated excitation energy, the degradation of the light-emitting material emitting light at lowest energy is accelerated arises. Furthermore, there causes a problem that the emission spectrum becomes broad and spectrum having high color purity, which is essential for full color display, is not attained.

In a preferred embodiment of the present invention, two or more light-emitting materials are preferably one or more electron transport light-emitting materials and one or more the hole transport light-emitting materials. That is, the light-emitting layer preferably includes the electron transport light-emitting material and the hole transport light-emitting material. The electron transport light-emitting material refers to a light-emitting material primarily having an electron-transporting property and the hole transport light-emitting material refers to a light-emitting material primarily having a hole-transporting property. Thereby, since it becomes possible to separate the migration paths of the hole and the electron in the light-emitting layer, it becomes possible to prevent the degradation of the light-emitting material associated with the migration of charges (hole and electron) further, and therefore the lifetime of the organic EL device can be further extended. Further, simultaneously, since excitation energy produced by recombination of the hole and the electron can be converted to light emission with efficiency, it becomes possible to improve the luminous efficiency and the luminance of the organic EL device.

In a preferred embodiment of the present invention, the light-emitting material is not particularly limited, but it is preferably composed of only the fluorescent material or only the phosphorescent material. That is, as a pattern of the light-emitting material, it is preferable that the two or more different light-emitting materials are fluorescent materials or phosphorescent materials. General examples of the light-emitting material include fluorescent materials to emit fluorescent light and phosphorescent materials to emit phosphorescent light, but by employing fluorescent materials as a light-emitting material of the present invention, reliability of the organic EL device can be improved. Further, by employing phosphorescent materials as a light-emitting material of the present invention, efficiency of the organic EL device can be improved. Further, if the two or more light-emitting materials are only the fluorescent material or only the phosphorescent material, properties of light-emitting materials are similar to each other, and therefore a width of spectrum is not widened (a half maximum full-width of spectrum is not widened) and light emission having high color purity is attained. On the other hand, a pattern of mixing the fluorescent material and the phosphorescent material between which a difference in luminance peak wavelength is about 50 nm or less is not so preferable from the following matters concerning energy levels to contribute to light emission. That is, (1) energy shifts from an excited singlet state of the phosphorescent material to a fluorescent material and only the fluorescent material emits light and only light emission from one side is obtained, and therefore damages are concentrated on the fluorescent material and degradation is accelerated, (2) energy shifts from an excited singlet state of the phosphorescent material to an excited triplet state of the phosphorescent material via an excited singlet state of the fluorescent material, and only light emission from one side is obtained, and therefore damages are concentrated on the phosphorescent material and degradation is accelerated as with the above paragraph (1). The fluorescent material is a light-emitting material which can convert energy produced when energy shifts from an excited singlet state to a ground state to light, and the phosphorescent material is a light-emitting material which can convert energy produced when energy shifts from an excited triplet state to a ground state to light.

Further, the organic EL device according to a preferred embodiment of the present invention is suitable for a polymer type organic EL device. That is, in a preferred embodiment of the present invention, the light-emitting layer preferably includes light-emitting polymer materials. In the polymer type organic EL device, current device constitutions generally have a layered structure of anode/hole injection layer/hole transport layer/light-emitting layer/cathode as distinct from the common device constitution (for example, a layered structure of anode/hole injection layer/hole transport layer/light-emitting layer/electron transport layer/cathode) of an organic EL device using small molecular light-emitting materials (a small molecular type organic EL device). Thus, since one side of the light-emitting layer directly contacts with metal or an inorganic material of the cathode or the like, energy of an exciter, which is produced by recombination of the hole and the electron in the light-emitting layer and used for light emission of the light-emitting material under normal conditions, is quenched (extinction) or deactivated at the cathode. The present inventors have found that because of this deactivation, light emission near the cathode was decreased to lose a balance between charges, and this unbalance had a negative effect particularly remarkably on the driving voltage, the luminous efficiency and the lifetime of the high molecular organic EL device. Thus, since the organic EL device according to a preferred embodiment of the present invention can attain a remarkable effect in the form where the light-emitting layer directly contacts with the cathode it becomes possible to remarkably improve light-emitting properties, particularly a lifetime, of the polymer type organic EL device. In addition, the light-emitting polymer material refers to a light-emitting material including a polymer substance.

As for the constitution of the organic EL device according to a preferred embodiment of the present invention, if the organic EL device includes such the constituents, it does not matter whether the organic EL device includes other constituents or not and its constitution is not particularly limited, and for example, the organic layer may include charge transport/injection layers such as a hole injection layer, a hole transport layer, an electron transport layer and an electron injection layer in addition to the light-emitting layer. The constitution of the organic EL device according to a preferred embodiment of the present invention is exemplified below as the forms (1) to (11), but the constitution of the organic EL device of the present invention is not limited to these forms. Further, a layer contained in each constituent is not necessarily a single layer but may have a layered structure. That is, at least one of the constituents of the anode, the hole injection layer, the hole transport layer, the light-emitting layer, the electron transport layer, the electron injection layer, and the cathode may have a structure in which two or more layers are stacked. In addition, the hole injection layer includes the hole injection material having an excellent hole-injecting property into the organic layer and has a function of improving the injection efficiency of a hole from the anode into the organic layer. The electron injection layer includes the electron injection material having an excellent electron-injecting property into the organic layer and has a function of improving the injection efficiency of an electron from the cathode into the organic layer. The hole transport layer includes the hole transport material having an excellent hole-transporting property and has a function of transporting a hole from the anode to the organic layer. The electron transport layer includes the electron transport material having an excellent electron-transporting property and has a function of transporting an electron from the cathode to the organic layer. Further, in the same layer of each organic layer, a light-emitting material, a hole injection material, a hole transport material, an electron injection material and an electron transport material may be mixed to be used.

(1) Anode/light-emitting layer/cathode
(2) Anode/hole transport layer/light-emitting layer/cathode
(3) Anode/hole injection layer/light-emitting layer/cathode
(4) Anode/hole injection layer/hole transport layer/light-emitting layer/cathode
(5) Anode/light-emitting layer/electron transport layer/cathode
(6) Anode/light-emitting layer/electron injection layer/cathode
(7) Anode/light-emitting layer/electron transport layer/electron injection layer/cathode
(8) Anode/hole transport layer/light-emitting layer/electron transport layer/cathode
(9) Anode/hole injection layer/hole transport layer/light-emitting layer/electron transport layer/cathode
(10) Anode/hole transport layer/light-emitting layer/electron transport layer/electron injection layer/cathode
(11) Anode/hole injection layer/hole transport layer/light-emitting layer/electron transport layer/electron injection layer/cathode A method of forming the above-mentioned constituents is not particularly limited and formation methods heretofore used in the production of the organic EL device can be used. Examples of a method of forming the organic layer (including the light-emitting layer, the hole transport layer, the electron transport layer, the hole injection layer, the electron injection layer, and the like) include dry processes such as a vapor deposition method and the like, and wet processes such as a spin coating method, a doctor blade method, a dip-coating method and a printing method in the case where patterning of the organic layer is not required. Further, in the case where patterning of the organic layer is required, for example, in preparing an organic EL device to be used for a multicolor or a full color display panel, dry processes such as a mask vapor deposition method (Japanese Patent Application Laid-Open No. H8-227276), a transfer method (Japanese Patent Application Laid-Open No. H10-208881) and the like, and wet processes such as an ink-jet method (Japanese Patent Application Laid-Open No. H10-12377), a printing method, a discharge coating method, a spray coating method and the like can be used. When the organic layer is formed by the wet process, from the viewpoint of preventing the moisture absorption in the organic layer and the degradation of the organic materials, the organic layer is preferably formed in an inert gas and heating/drying are preferably performed in order to remove a residual solvent after forming the organic layer. Heating/drying are preferably performed in an inert gas from the viewpoint of preventing the degradation of the organic materials, and heating/drying are preferably performed under a reduced pressure for removing a residual solvent more effectively.

A driving system of the organic EL device according to a preferred embodiment of the present invention is not particularly limited, and either a passive type or an active type may be used, the effects and advantages of preferred embodiments of the present invention can be more remarkably exhibited in the passive type organic EL device because it is necessary to apply a higher voltage to the passive type organic EL device than that to the active type organic EL device and therefore a higher electric field is applied to the passive type device. A system of lighting of the organic EL device according to a preferred embodiment of the present invention is not particularly limited, and both a bottom emission type in which light is taken out from the substrate side and a top emission type in which light is taken out from the opposite side of the substrate may be used.

Another preferred embodiment of the present invention also pertains to an organic electroluminescent display device including the organic electroluminescent device. Since the organic EL device according to a preferred embodiment of the present invention has excellent light-emitting properties, particularly a long lifetime, it becomes possible to improve characteristics of the organic EL display according to a preferred embodiment of the present invention, particularly to extend the lifetime. In addition, the organic EL device according to a preferred embodiment of the present invention can be used not only as the organic EL display but also as other light-emitting elements for illumination application and the like.

In accordance with the organic EL device according to a preferred embodiment of the present invention, since the light-emitting layer contains two or more different light-emitting materials and a difference in photoluminescence peak wavelength between the two or more different light-emitting materials preferably is about 50 nm or less, it becomes possible to extend the lifetime of the organic EL device. Further, when the light-emitting layer includes the transport light-emitting material and the hole transport light-emitting material, it becomes possible to improve the luminous efficiency and the luminance of the organic EL device further.

Other features, elements, steps, characteristics and advantages of the present invention will become more apparent from the following detailed description of preferred embodiments of the present invention with reference to the attached drawings.

BRIEF DESCRIPTIONS OF THE DRAWINGS

DETAILED DESCRIPTION OF THE PREFERRED EMBODIMENTS

Hereinafter, the present invention will be described in more detail by way of preferred embodiments below referring to drawings, but the present invention is not limited to these preferred embodiments.

Preferred Embodiment 1

Figure 1:
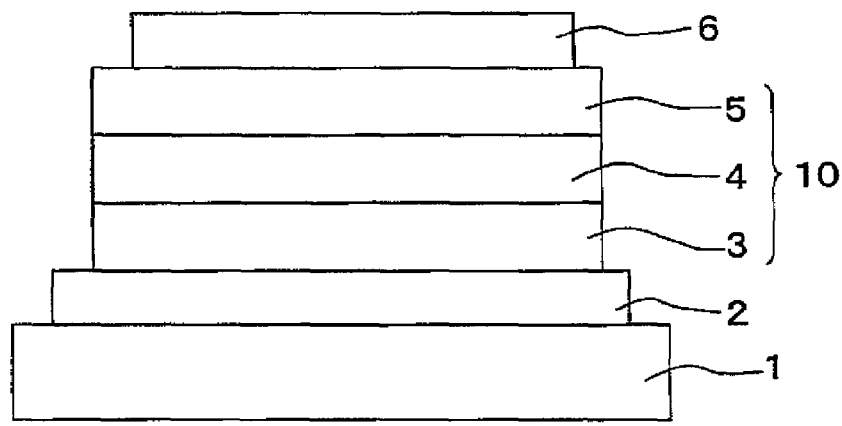
FIG. 1 is a schematic sectional view of the organic EL device of Preferred Embodiment 1 of the present invention.

FIG. 1 is a schematic sectional view of the organic EL device of Preferred Embodiment 1.

The organic EL device of the present preferred embodiment has a layered structure in which an anode 2, an organic layer 10 which is a layered body including a hole injection layer 3, a hole transport layer 4 and a light-emitting layer 5, and a cathode 6 are located on a substrate 1 in turn. Thus, in the organic layer 10, since the light-emitting layer 5 is separated from the hole injection layer 3, injection efficiency of the hole into the light-emitting layer 5 is improved. Further, since the hole transport layer 4 is located between the light-emitting layer 5 and hole injection layer 3, injection efficiency of the hole into the light-emitting layer 5 is improved. Consequently, in the organic EL device of this preferred embodiment, the luminance and the luminous efficiency can be increased compared to the organic EL device in which the hole injection layer 3 and the hole transport layer 4 are not arranged. Further, the light-emitting layer 5 may be a single layer or may have a multilayer structure.

The substrate 1 is not particularly limited as long as it has an insulating surface, and for example, substrates formed from inorganic materials such as glass, quartz and the like, substrates of plastic such as polyethylene terephthalate and the like, substrates of ceramic such as alumina and the like, substrates formed by coating substrates of metal such as aluminum, iron and the like with an inorganic insulating material such as $SiO_2$ or an organic insulating material, and substrates obtained by applying an insulating treatment to the surface of a metal substrate by anodic oxidation can be widely used. Further, when the active type organic EL device is used, a switching element such as a thin film transistor (TFT) may be formed on the substrate 1. In addition, when the TFT is formed, at least two TFTs per pixel, that is, a TFT for switching connected to a scanning signal line and data signal line, and a driving TFT connected to the TFT for switching, a power supply line and the anode are preferably formed in the pixel. When a polysilicon TFT is formed by a low temperature process, a substrate which is not melted or deformed at 500° C. or lower, for example, a glass substrate is preferably used. Further, when a polysilicon TFT is formed by a high temperature process, a substrate which is not melted or deformed at 1000° C. or lower, for example, a quartz substrate is preferably used. Furthermore, when a lighting system of the organic EL device of this preferred embodiment is a bottom emission type, it is preferable to use a substantially transparent and colorless substrate as a substrate 1.

Conventional electrode materials can be used for the anode 2 and the cathode 6. Examples of the anode 2 to inject the hole into the organic layer include a metal electrode which is formed from metal (Au, Pt, Ni, etc.) having a high (preferably about 4 eV or more) work function and a transparent electrode which is formed using transparent conductive materials (ITO, IDIXO (registered trademark), $SnO_2$, etc.). When light is taken out from the anode 2 side, it is preferable that light transmittance is increased (preferably about 20% or more). Further, a sheet resistance of the anode 2 is preferably small, and specifically it is more preferably about 50 Ω/square or less. Furthermore, a film thickness of the anode 2 is preferably within a range of about 1 nm to about 1 μm depending on the materials to be used, and more preferably within a range of about 10 nm to about 200 nm. Examples of the cathode 6 to inject the electron into the organic layer include electrodes (Ca/Al, Ce/Al, Cs/Al, Ba/Al, etc.) formed by stacking the metal having a low (preferably 4 eV or less) work function on stable metal, electrodes (Ca—Al alloy, Mg—Ag alloy, Li—Al alloy, etc.) containing metal having a low work function, and electrodes (LiF/Al, LiF/Ca/Al, $BaF_2$/Ba/Al, etc.) of a combination of an insulating layer (thin film) and a metal electrode. When light is taken out from the cathode 6 side, it is preferable that light transmittance is increased (preferably about 20% or more) by forming the cathode 6 into the form of island. Further, a sheet resistance of the cathode 6 is preferably small, and specifically it is more preferably about 50 Ω/square or less. Furthermore, a film thickness of the cathode 6 is preferably within a range of about 1 nm to about 1 μm depending on the materials to be used, and more preferably within a range of about 1 nm to about 200 nm. Examples of a method of forming the anode 2 and the cathode 6 include dry processes such as a vapor deposition method, an electron beam (EB) deposition method, a molecular beam epitaxy (MBE) method, and a sputtering method, and wet processes such as a spin coating method, a printing method, and an ink-jet method. In addition, in the organic EL device of this preferred embodiment, it is preferable that at least one of the anode 2 and the cathode 6 is transparent or semitransparent, and thereby light can be taken out efficiently from the light-emitting layer 5. Further, when the passive type organic EL device is used, the anode 2 preferably is formed in the form of stripe, and the cathode 6 is formed in the form of stripe in a direction orthogonal to the anode 2 via the organic layer 10. On the other hand, when the active type organic EL device is used, the anode 2 is formed in the form of matrix in every pixel, and the cathode 6 is formed over the almost whole surface via the organic layer 10.

As a hole injection material contained in the hole injection layer 3, publicly known hole injection materials for an organic EL device or for an organic photoconductor can be used, and for example, inorganic p-type semiconductor materials; small molecular materials such as porphyrin compounds, aromatic tertiary amine compounds, for example, N,N'-bis(3-methylphenyl)-N,N'-bis(phenyl)benzidine (TPD) and N,N'-di(naphthalene-1-yl)-N,N'-diphenyl-benzidin (NPD), hydrazone compounds, quinacridone compounds and styrylamine compounds; polymer materials such as polyaniline (PANI), poly(3,4-ethylenedioxythiophene/poly (styrene sulfonate) (PEDT/PSS), poly(triphenylamine) derivative (poly-TPD) and polyvinylcarbazole (PVCz); and high molecular material precursors such as poly(p-phenylenevinylene) precursor (pre-PPV) and poly(p-naphthalenevinylene) precursor (pre-PNV) can be used. A film thickness of the hole injection layer 3 is preferably within a range of about 1 nm to about 10 μm depending on the materials to be used, and more preferably within a range of about 10 nm to about 100 nm. In addition, the hole injection layer 3 may preferably include two or more hole injection materials. Further, the hole injection layer 3 may be a layer formed by stacking a plurality of hole injection layers containing different hole injection materials.

Examples of a method of forming the hole injection layer 3 include a method of forming the layer by a wet process using a coating solution for forming a hole injection layer prepared by dissolving at least one hole injection material in a solvent, and a method of forming the layer by a dry process using at least one hole injection material. The solvent used in the wet process may be a solvent in which the hole injection material can be dissolved or dispersed, and for example, pure water, methanol, ethanol, tetrahydrofuran (THF), chloroform, xylene, and trimethylbenzene can be used. Further, the coating solution for forming a hole injection layer preferably includes a resin for binding from the viewpoint of improving the adhesion between the hole injection layer 3 and the anode 2. Furthermore, in addition to this resin, the coating solution for forming a hole injection layer may contain a leveling agent, additives (donor, acceptor, etc.) and the like. As the resin for binding, for example, polycarbonate, polyester and like can be used. On the other hand, when the hole injection layer 3 is formed by the dry process, the hole injection layer 3 may include additives (donor, acceptor) and the like.

As a hole transport material contained in the hole transport layer 4, the material similar to the hole injection material can be used, it is preferable to select the hole transport material and the hole injection material in such a way that an absolute value of a HOMO level of the hole transport material is larger than an absolute value of a HOMO level of the hole injection material. Thereby, the hole can be more efficiently injected in and transported to the light-emitting layer 5, and reduction in the driving voltage and/or improvement in the luminous efficiency of the organic EL device become possible. Further, it is preferable to select the hole transport material and the hole injection material in such a way that an absolute value of a LUMO level of the hole transport material is smaller than an absolute value of a LUMO level of the hole injection material. Thereby, the electron can be more efficiently confined in the light-emitting layer 5, and improvement in the luminous efficiency of the organic EL device become possible. Furthermore, the hole transport material is preferably a material capable of transporting the hole to the light-emitting layer 5 at a lower electric field, and specifically, the hole mobility of the hole transport material is more preferably about $10^{-6}$ cm$^2$/V·s or more at an electric field intensity of about $10^4$ V/cm to about $10^6$ V/cm. A film thickness of the hole transport layer 4 is preferably within a range of about 1 nm to about 10 μm depending on the materials to be used, and more preferably within a range of about 5 nm to about 100 nm. In addition, the hole transport layer 4 may include two or more hole transport materials. Further, the hole transport layer 4 may be a layer formed by stacking a plurality of hole transport layers containing different hole transport materials.

Examples of a method of forming the hole transport layer 4 include a method of forming the layer by a wet process using a coating solution for forming a hole transport layer prepared by dissolving at least one hole transport material in a solvent, and a method of forming the layer by a dry process using at least one hole transport material. The solvent used in the wet process may be a solvent in which the hole transport material can be dissolved or dispersed, and for example, pure water, methanol, ethanol, THF, chloroform, xylene, and trimethylbenzene can be used. Further, the coating solution for forming a hole transport layer preferably includes a resin for binding from the viewpoint of improving the adhesion between the hole transport layer 4 and the hole injection layer 3. Furthermore, in addition to this resin, the coating solution for forming a hole transport layer may include a leveling agent, additives (donor, acceptor) and the like. As the resin for binding, for example, polycarbonate, polyester and like can be used. On the other hand, when the hole transport layer 4 is formed by the dry process, the hole transport layer 4 may include additives (donor, acceptor) and the like.

The light-emitting layer 5 preferably includes two different light-emitting materials between which a difference in luminance peak wavelength preferably is about 50 nm or less. Thereby, it becomes possible to extend the lifetime of the organic EL device of this preferred embodiment. Further, the light-emitting layer 5 preferably includes the electron transport light-emitting material and the hole transport light-emitting material. Thereby, it becomes possible to further extend the lifetime of the organic EL device of this preferred embodiment and to improve the luminous efficiency and the luminance. Furthermore, the light-emitting materials contained in the light-emitting layer 5 are preferably a fluorescent material or a phosphorescent material. Thereby, the reliability or the efficiency of the organic EL device of this preferred embodiment can be improved.

A light emitting material included in the light-emitting layer 5 is not particularly limited and publicly known light-emitting materials for an organic EL device can be used as the light-emitting material. Examples of the fluorescent materials of these light-emitting materials include small molecular light-emitting materials (for example, aromatic dimethylidene compounds such as 4,4'-bis(2,2'-diphenylvinyl)-biphenyl (DPVBi) and the like, oxadiazole compounds such as 5-methyl-2-{2-[4-(5-methyl-2-benzoxazolyl)phenyl]vinyl}benzoxazole and the like, triazole derivatives such as 3-(4-biphenylyl)-4-phenyl-5-t-butylphenyl-1,2,4-triazole (TAZ) and the like, styrylbenzene compounds such as 1,4-bis(2-methylstyryl)benzene and the like, fluorescent organic materials such as thiopyrazine dioxide derivative, benzoquinone derivative, naphthoquinone derivative, anthraquinone derivative, diphenoquinone derivative, fluorenone derivative and the like, and fluorescent organic metal compounds such as azomethine zinc complex, (8-hydroxyquinolinato)aluminum complex (Alq3) and the like), light-emitting polymer materials (for example, poly(2-decyloxy-1,4-phenylene)(DO-PPP), poly{2,5-bis-[2-(N,N,N-triethylammonium)ethoxy]-1,4-phenyl-alt-1,4-phenyllene}dibromide (PPP-NEt3+), poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), poly[2,5-bis-(hexyloxy)-1,4-phenylene-(1-cyanovinylene)] (CN—PPV), (poly(9,9-dioctylfluorene))(PDAF), polyspiro, etc.), and light-emitting polymer material precursors (for example, PPV precursor, PNV precursor, PPP precursor, etc.). And, examples of the phosphorescent materials of these light-emitting materials include phosphorescent organic metal compounds such as an iridium complex (for example, Ir(ppy)$_3$, etc.), a platinum complex (for example, PtOEP, etc.) and the like, and light-emitting polymer materials such as iridium complex-carbazole copolymer and the like.

Examples of a method of forming the light-emitting layer 5 include a method of forming the layer by a wet process using a coating solution for forming a light-emitting layer prepared by dissolving a light-emitting material in a solvent. The coating solution for forming a light-emitting layer is a solution containing two different light-emitting materials between which a difference in luminance peak wavelength is about 50 nm or less. Further, the coating solution for forming a light-emitting layer preferably includes the electron transport light-emitting material and the hole transport light-emitting material. Furthermore, all of the light-emitting materials included in the coating solution for forming a light-emitting layer are preferably a fluorescent material or a phosphorescent material. The solvent used in the wet process is not particularly limited as long as it is a solvent in which the light-emitting material can be dissolved or dispersed, and for example, pure water, methanol, ethanol, THF, chloroform, toluene, xylene, and trimethylbenzene can be used. Further, the coating solution for forming a light-emitting layer preferably includes a resin for binding in addition to the light-emitting material from the viewpoint of improving the adhesion between the light-emitting layer 5 and the hole transport layer 4. Furthermore, in addition to this resin, the coating solution for forming a light-emitting layer may include a leveling agent, a light-emitting assist agent, charge injection/transport materials (a hole injection material, a hole transport material, an electron transport material, an electron injection material, etc.), additives (donor, acceptor, etc.) and a light-emitting dopant. Examples of the resin for binding include polycarbonate, polyester and like.

In this preferred embodiment, a seal substrate (not shown) is further used to seal the organic EL device, but a seal film (not shown) may be used in place of the seal substrate. As a material of the seal film or the seal substrate, materials hitherto used for sealing can be used. As a sealing method, publicly known sealing methods can be used, and for example, a method of filling an inert gas such as nitrogen gas, argon gas and the like and sealing with glass or metal, and a method of mixing an absorbent such as barium oxide in the inert gas in the above-mentioned method can be used. Further, the seal film may also be formed by applying a resin directly onto the cathode 6 by spin-coating or bonding. By thus sealing the organic layer 10 and the electrodes (anode 2 and cathode 6), it is possible to prevent the external oxygen or moisture from penetrating into the organic EL device, and therefore the lifetime of the organic EL device of this preferred embodiment can be improved.

Hereinafter, the results of the luminance and the half lifetime evaluated altering the material of the light-emitting layer of the organic EL device having the constitution described in Preferred Embodiment 1 will be described.

Example 1

A method of producing an organic EL device of Example 1 will be described.

First, an anode 2 was formed on a substrate 1 having an insulating surface. In this example, a substrate with electrodes, in which an ITO electrode had been previously formed on the surface of a glass substrate of 30 mm×30 mm square as an anode 2, was prepared and cleaned. As for cleaning of the substrate with electrodes, ultrasonic cleaning was performed for 10 minutes and then UV-ozone cleaning was performed for 30 minutes using acetone and isopropyl alcohol.

Next, a hole injection layer 3 of 60 nm in thickness was formed on the surface of the anode 2. First, a coating solution for forming a hole injection layer was prepared by dispersing PEDOT/PSS in pure water. This coating solution for forming a hole injection layer was applied onto the surface of the anode 2 using a spin coater. Thereafter, a solvent in the coating solution for forming a hole injection layer was removed by heating/drying (200° C., 5 minutes) the substrate in an atmosphere of high-purity nitrogen (10 ppm or less) to form a hole injection layer 3.

Next, a hole transport layer 4 of 10 nm in thickness was formed on the hole injection layer 3. First, a coating solution for forming a hole transport layer was prepared by dissolving a poly(triphenylamine) derivative in toluene. This coating solution for forming a hole transport layer was applied onto the surface of the hole transport layer 4 using a spin coater. Thereafter, a solvent in the coating solution was removed by heating/drying (200° C., 1 hour) the substrate in an atmosphere of high-purity nitrogen to form a hole transport layer 4.

Next, a light-emitting layer 5 of 80 nm in thickness was formed on the hole transport layer 4. First, a coating solution for forming a light-emitting layer was prepared by dissolving an electron transport red light-emitting polymer material (phosphorescent material; iridium complex-carbazole copolymer) containing a chromophore having a luminance peak at a wavelength of 610 nm and an electron transport red light-emitting polymer material (phosphorescent material; platinum complex-carbazole copolymer) containing a chromophore having a luminance peak at a wavelength of 660 nm in xylene. This coating solution for forming a light-emitting layer was applied onto the surface of the hole transport layer 4 using a spin coater. Thereafter, a solvent in the coating solution was removed by heating/drying (150° C., 1 hour) the substrate in an atmosphere of high-purity nitrogen to form a light-emitting layer 5. As described above, all of the light-emitting materials in this example are a phosphorescent material.

Next, an electrode 6 was formed on the light-emitting layer 5. First, the substrate was fixed to a chamber for metal vapor deposition, and barium of 3 nm in thickness was deposited on the surface of the light-emitting layer 5 by a vapor deposition method, and subsequently aluminum of 300 nm in thickness was deposited in the same way to thereby form a cathode 6.

Finally, a sealing glass (not shown) was bonded to the substrate 1 using an ultraviolet curable resin to seal the organic layer 10 (the hole injection layer 3, the hole transport layer 4 and the light-emitting layer 5), the anode 2 and the cathode 6 to thereby complete an organic EL device of the present invention was completed.

Example 2

Since the constitution of an organic EL device of Example 2 is similar to that of Example 1 and the light-emitting materials contained in the light-emitting layers 5 are just different from each other, the descriptions of overlapping contents between Example 1 and Example 2 will be omitted.

The light-emitting layer 5 of this example was prepared using a coating solution for forming a light-emitting layer prepared by dissolving an hole transport blue light-emitting polymer material (fluorescent material; a poly(triphenylamine) derivative) containing a chromophore having a luminance peak at a wavelength of 464 nm and an electron transport blue light-emitting polymer material (fluorescent material; poly(fluorene-anthracene)) containing a chromophore having a luminance peak at a wavelength of 466 nm in xylene. As described above, all of the light-emitting materials in this example are a fluorescent material.

Example 3

Since the constitution of an organic EL device of Example 3 is similar to that of Example 1 and the light-emitting materials contained in the light-emitting layers 5 are just different from each other, the descriptions of overlapping contents between Example 1 and Example 3 will be omitted.

The light-emitting layer 5 of this example was prepared using a coating solution for forming a light-emitting layer prepared by dissolving an hole transport blue light-emitting polymer material (fluorescent material; a poly(triphenylamine) derivative) containing a chromophore having a luminance peak at a wavelength of 464 nm and an electron transport blue light-emitting polymer material (fluorescent material; polyfluorene) containing a chromophore having a luminance peak at a wavelength of 460 nm in xylene. As described above, all of the light-emitting materials in this example are a fluorescent material.

Example 4

Since the constitution of an organic EL device of Example 4 is similar to that of Example 1 and the light-emitting materials contained in the light-emitting layers 5 are just different from each other, the descriptions of overlapping contents between Example 1 and Example 4 will be omitted.

The light-emitting layer 5 of this example was prepared using a coating solution for forming a light-emitting layer prepared by dissolving an hole transport blue light-emitting polymer material (fluorescent material; a poly(triphenylamine) derivative) containing a chromophore having a luminance peak at a wavelength of 464 nm, a hole transport blue light-emitting polymer material (fluorescent material; poly (fluorene-anthracene)) containing a chromophore having a luminance peak at a wavelength of 466 nm and an electron transport blue light-emitting polymer material (fluorescent material; polyfluorene) containing a chromophore having a luminance peak at a wavelength of 460 nm in xylene. As described above, all of the light-emitting materials in this example are a fluorescent material.

Comparative Example 1

Since the constitution of an organic EL device of Comparative Example 1 is similar to that of Example 1 and the light-emitting materials contained in the light-emitting layers 5 are just different from each other, the descriptions of overlapping contents between Example 1 and Comparative Example 1 will be omitted.

The light-emitting layer 5 of this comparative example was prepared using a coating solution for forming a light-emitting layer prepared by dissolving an hole transport blue light-emitting polymer material (fluorescent material; a poly(triphenylamine) derivative) containing a chromophore having a luminance peak at a wavelength of 464 nm and an electron transport red light-emitting polymer material (phosphorescent material; iridium complex-carbazole copolymer) containing a chromophore having a luminance peak at a wavelength of 660 nm in xylene. As described above, the light-emitting materials in this comparative example include the blue light-emitting polymer material of the fluorescent material and the red light-emitting polymer material of the phosphorescent material.

Comparative Example 2

Since the constitution of an organic EL device of Comparative Example 2 is similar to that of Example 1 and the light-emitting materials contained in the light-emitting layers 5 are just different from each other, the descriptions of overlapping contents between Example 1 and Comparative Example 2 will be omitted.

The light-emitting layer 5 of this comparative example was prepared using a coating solution for forming a light-emitting layer prepared by dissolving an electron transport blue light-emitting polymer material (fluorescent material; poly(fluorene-anthracene)) containing a chromophore having a luminance peak at a wavelength of 466 nm and an electron transport green light-emitting polymer material (fluorescent material; poly(fluorene-thiophene)) containing a chromophore having a luminance peak at a wavelength of 538 nm in xylene. As described above, all of the light-emitting materials in this example are a fluorescent material.

Measurement of Luminance and Half Lifetime

Hereinafter, the results of measurement of the luminance and the half lifetime of the organic EL devices of Examples 1 to 3 and Comparative Examples 1 and 2 are described referring to FIGS. 2 to 6. As for the luminance, luminance (cd/m$^2$) at the time when a voltage of 7.5 V was applied to the organic EL device was measured. The half lifetime was determined by measuring the time (h) taken for the luminance to be reduced to 50% of initial under the condition that a constant current (100 mA/cm$^2$) is applied to the organic EL device to allow the organic EL device to emit light continuously. Measurement of the luminance and the half lifetime was performed altering a mole fraction of the two different light-emitting materials contained in the light-emitting layers 5 of Examples and Comparative Examples.

Figure 2:
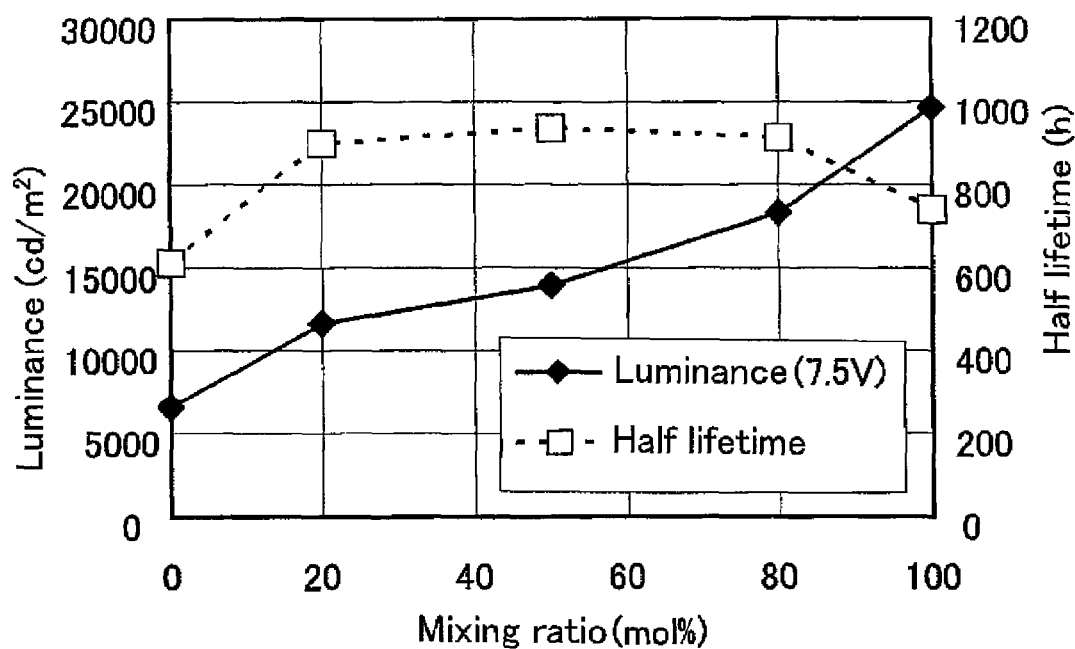
FIG. 2 is a graph showing the results of measurement of the luminance and the half lifetime of the organic EL device of Example 1.

In FIG. 2, the results of measurement of the luminance and the half lifetime of the organic EL device of Example 1 are shown. In FIG. 2, a mixing ratio represents a ratio of the electron transport red light-emitting polymer material (mol) containing a chromophore having a luminance peak at a wavelength of 610 nm to two light-emitting materials (mol) used in Example 1. That is, the mixing ratio of 100 mol % means that the light-emitting layer 5 of Example 1 contains only the electron transport red light-emitting polymer material containing a chromophore having a luminance peak at a wavelength of 610 nm, and the mixing ratio of 0 mol % means that the light-emitting layer 5 of Example 1 contains only the electron transport red light-emitting polymer material containing a chromophore having a luminance peak at a wavelength of 660 nm.

From FIG. 2, it is found that by using, as the light-emitting layer 5, the layer formed by mixing two different light-emitting materials between which a difference in luminance peak wavelength is 50 nm, the half lifetime of the organic EL device of Example 1 can be improved compared to the case of not mixing the light-emitting materials, and particularly, the half lifetime in the case where the mixing ratio is 50 mol % could be improved by 1.3 times compared to that in the case where the mixing ratio is 100 mol %.

Figure 3:
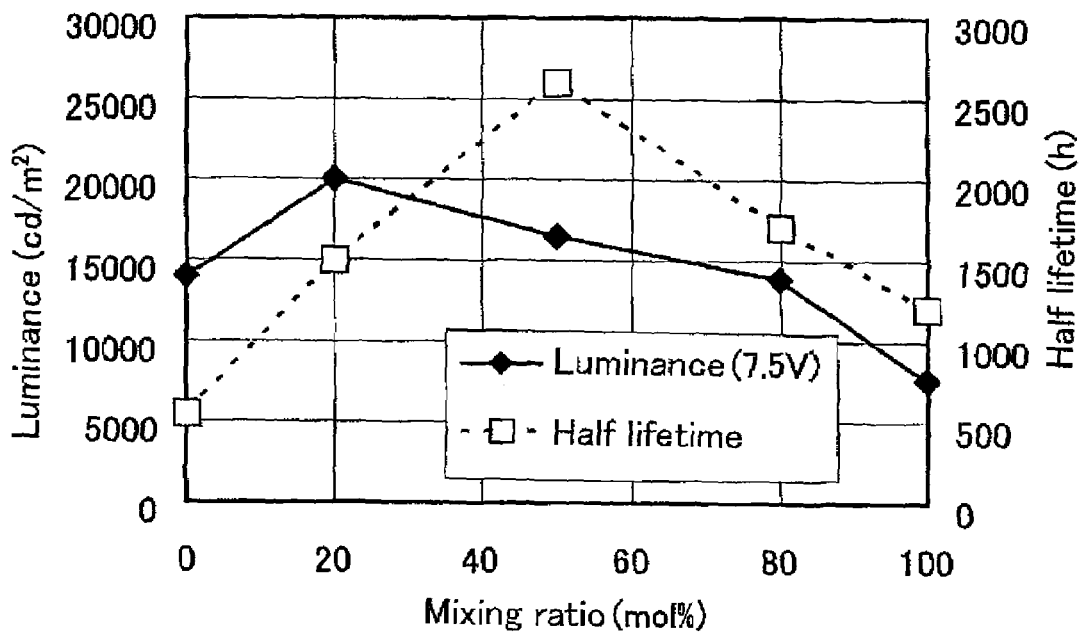
FIG. 3 is a graph showing the results of measurement of the luminance and the half lifetime of the organic EL device of Example 2.

In FIG. 3, the results of measurement of the luminance and the half lifetime of the organic EL device of Example 2 are shown. In FIG. 3, a mixing ratio represents a ratio of the electron transport blue light-emitting polymer material (mol) containing a chromophore having a luminance peak at a wavelength of 466 nm to two light-emitting materials (mol) used in Example 2. That is, the mixing ratio of 100 mol % means that the light-emitting layer 5 of Example 2 contains only the electron transport blue light-emitting polymer material containing a chromophore having a luminance peak at a wavelength of 466 nm, and the mixing ratio of 0 mol % means that the light-emitting layer 5 of Example 2 contains only the hole transport blue light-emitting polymer material containing a chromophore having a luminance peak at a wavelength of 464 nm.

From FIG. 3, it is found that by using, as the light-emitting layer 5, the layer formed by mixing two different light-emitting materials between which a difference in luminance peak wavelength is about 2 nm, the half lifetime of the organic EL device of Example 2 can be improved compared to the case of not mixing the light-emitting materials, and particularly, the half lifetime in the case where the mixing ratio is about 50 mol % could be improved by about 2 times compared to that in the case where the mixing ratio is about 100 mol %. Further, by using the electron transport light-emitting material and the hole transport light-emitting material as a light-emitting material, the luminance of the organic EL device of Example 2 can be improved compared to the case of not mixing the light-emitting materials, and particularly, the luminance in the case where the mixing ratio is about 20 mol % could be improved by about 1.5 times compared to that in the case where the mixing ratio is 0 mol %, and there was an effect of improving a property, which is superior to the organic EL device of Example 1 in which two electron transport light-emitting materials are mixed.

Figure 4:
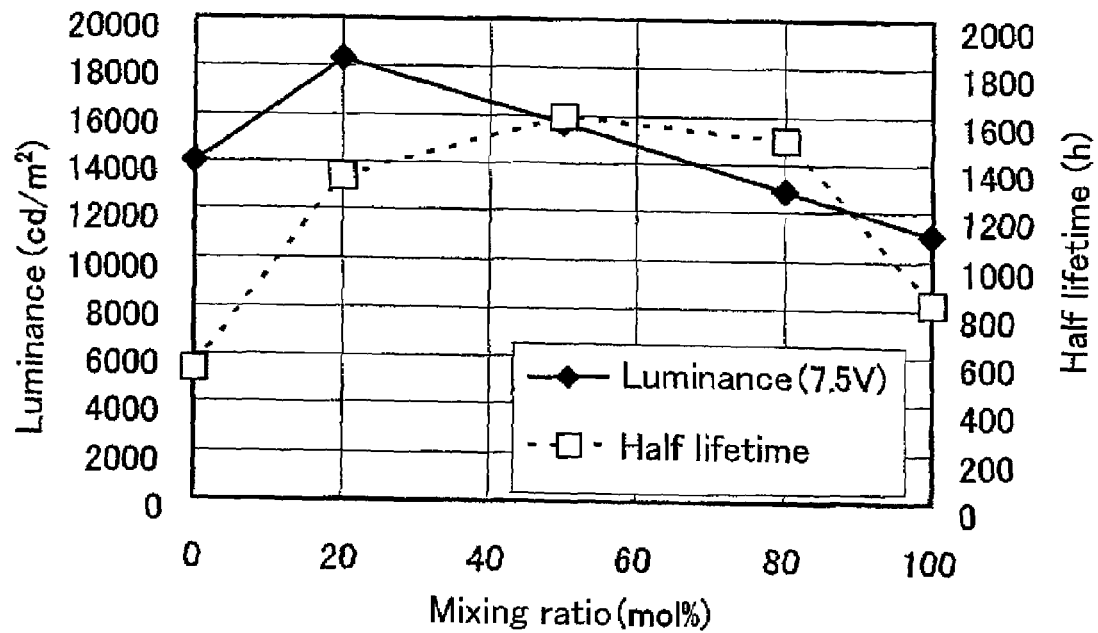
FIG. 4 is a graph showing the results of measurement of the luminance and the half lifetime of the organic EL device of Example 3.

In FIG. 4, the results of measurement of the luminance and the half lifetime of the organic EL device of Example 3 are shown. In FIG. 4, a mixing ratio represents a ratio of the electron transport blue light-emitting polymer material (mol) containing a chromophore having a luminance peak at a wavelength of 460 nm to two light-emitting materials (mol) used in Example 3. That is, the mixing ratio of 100 mol % means that the light-emitting layer 5 of Example 3 contains only the electron transport blue light-emitting polymer material containing a chromophore having a luminance peak at a wavelength of 460 nm, and the mixing ratio of 0 mol % means that the light-emitting layer 5 of Example 3 contains only the hole transport blue light-emitting polymer material containing a chromophore having a luminance peak at a wavelength of about 464 nm.

From FIG. 4, it is found that by using, as the light-emitting layer 5, the layer formed by mixing two different light-emitting materials between which a difference in luminance peak wavelength is about 4 nm, the half lifetime of the organic EL device of Example 3 can be improved compared to the case of not mixing the light-emitting materials, and particularly, the half lifetime in the case where the mixing ratio is about 50 mol % could be improved by about 2 times compared to that in the case where the mixing ratio is about 100 mol %. Further, by using the electron transport light-emitting material and the hole transport light-emitting material as a light-emitting material, the luminance of the organic EL device of Example 3 can be improved compared to the case of not mixing the light-emitting materials, and particularly, the luminance in the case where the mixing ratio is about 20 mol % could be improved by about 1.3 times compared to that in the case where the mixing ratio is 0 mol %, and there was an effect of improving a property, which is superior to the organic EL device of Example 1 in which two electron transport light-emitting materials are mixed.

The results of measurement of the luminance and the half lifetime of the organic EL device of Example 4 are shown below. Here, a ratio of (the hole transport blue light-emitting polymer material containing a chromophore having a luminance peak at a wavelength of 464 nm), (the hole transport blue light-emitting polymer material containing a chromophore having a luminance peak at a wavelength of 466 nm) and (the electron transport blue light-emitting polymer material containing a chromophore having a luminance peak at a wavelength of 460 nm) was set at 25:25:50.

Consequently, by using, as the light-emitting layer 5, the layer formed by mixing three different light-emitting materials between which a difference in luminance peak wavelength is about 6 nm, the half lifetime of the organic EL device of Example 4 can be improved compared to the case of not mixing the light-emitting materials, and more specifically, the half lifetime could be improved by about 3 times compared to the half lifetime of the above-mentioned three different light-emitting materials. Further, by using the electron transport light-emitting material and the hole transport light-emitting material as a light-emitting material, the luminance of the organic EL device of Example 4 can be improved compared to the case of not mixing the light-emitting materials, and more specifically, the half lifetime could be improved by about 1.5 times compared to the luminance of the above-mentioned three different light-emitting materials, and there was an effect of improving a property, which is superior to the organic EL device of Example 3 in which two different light-emitting materials are mixed.

Figure 5:
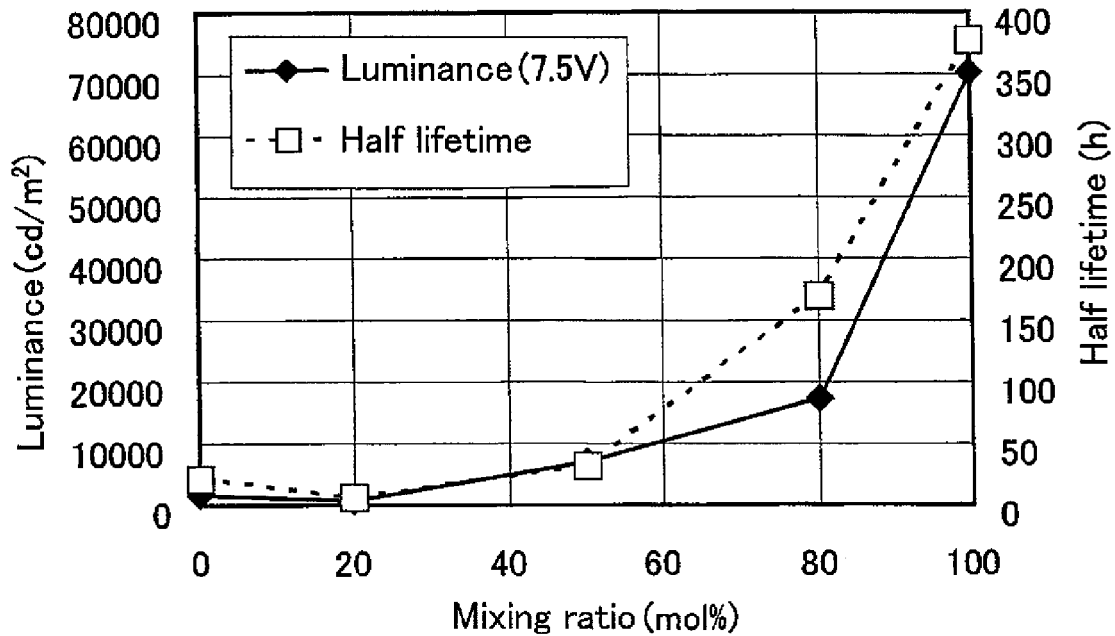
FIG. 5 is a graph showing the results of measurement of the luminance and the half lifetime of the organic EL device of Comparative Example 1.

In FIG. 5, the results of measurement of the luminance and the half lifetime of the organic EL device of Comparative Example 1 are shown. In FIG. 5, a mixing ratio represents a ratio of the electron transport red light-emitting polymer material (mol) containing a chromophore having a luminance peak at a wavelength of 660 nm to two light-emitting materials (mol) used in Comparative Example 1. That is, the mixing ratio of 100 mol % means that the light-emitting layer 5 of Comparative Example 1 contains only the electron transport red light-emitting polymer material containing a chromophore having a luminance peak at a wavelength of 660 nm, and the mixing ratio of 0 mol % means that the light-emitting layer 5 of Comparative Example 1 contains only the electron transport blue light-emitting polymer material containing a chromophore having a luminance peak at a wavelength of about 464 nm.

From FIG. 5, it is found that even if the layer formed by mixing two different light-emitting materials, between which a difference in luminance peak wavelength is about 196 nm, was used as the light-emitting layer 5, the luminance and the half lifetime of the organic EL device of Comparative Example 1 was not improved compared to the case of not mixing the light-emitting materials.

Figure 6:
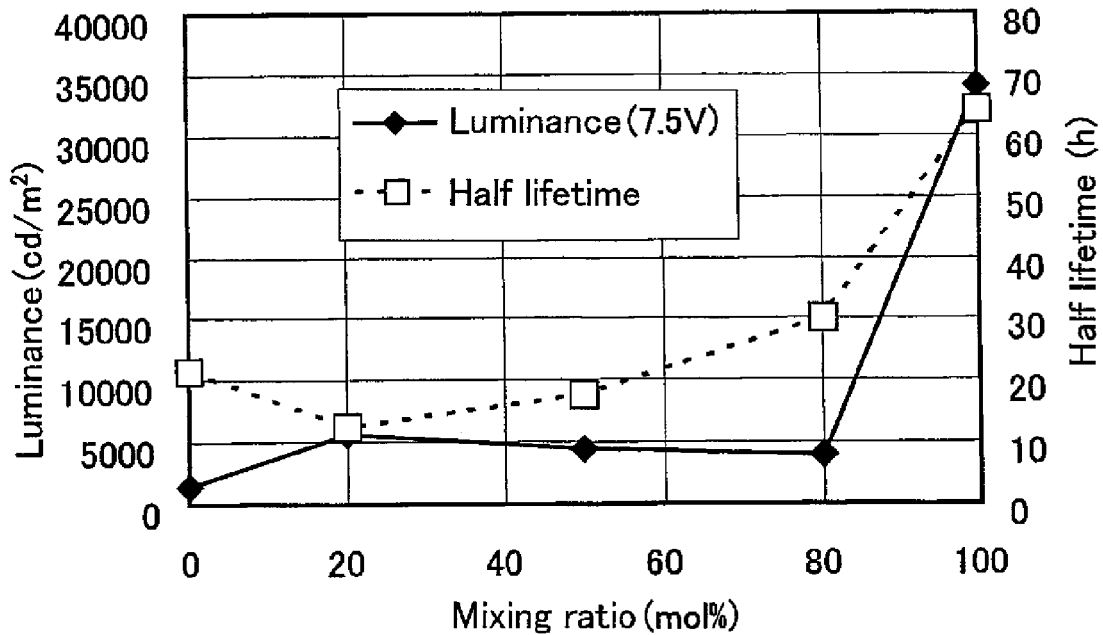
FIG. 6 is a graph showing the results of measurement of the luminance and the half lifetime of the organic EL device of Comparative Example 2.

In FIG. 6, the results of measurement of the luminance and the half lifetime of the organic EL device of Comparative Example 2 are shown. In FIG. 6, a mixing ratio represents a ratio of the electron transport green light-emitting polymer material (mol) containing a chromophore having a luminance peak at a wavelength of 538 nm to two light-emitting materials (mol) used in Comparative Example 2. That is, the mixing ratio of 100 mol % means that the light-emitting layer 5 of Comparative Example 2 contains only the electron transport green light-emitting polymer material containing a chromophore having a luminance peak at a wavelength of about 538 nm, and the mixing ratio of 0 mol % means that the light-emitting layer 5 of Comparative Example 2 contains only the electron transport blue light-emitting polymer material containing a chromophore having a luminance peak at a wavelength of about 466 nm.

From FIG. 6, it is found that even if the layer formed by mixing two different light-emitting materials, between which a difference in luminance peak wavelength is about 72 nm, was used as the light-emitting layer 5, the luminance and the half lifetime of the organic EL device of Comparative Example 2 was not improved compared to the case of not mixing the light-emitting materials.

From the above-mentioned descriptions, in the organic EL devices of Examples 1 to 4, it was found that by using, as the light-emitting layer 5, the layer formed by mixing two or more different light-emitting materials between which a difference in luminance peak wavelength is about 50 nm or less, the half lifetime of the organic EL devices can be extended. Further, in the organic EL devices of Examples 2 to 4, it was found that by using the electron transport light-emitting material and the hole transport light-emitting material as a light-emitting material, the luminance of the organic EL device can be increased. On the other hand, in the organic EL devices of Comparative Examples 1 and 2, since the layer in which two different light-emitting materials, between which a difference in luminance peak wavelength is more than about 50 nm, was used as a light-emitting layer 5, it was found that the half lifetime and the luminance of the organic EL device were not increased.

This application claims a priority by virtue of the Paris convention or provision of low in a state to be transferred based on Japanese application No. 2006-37020, filed on Feb. 14, 2006, which is herein incorporated by reference in its entirety.

In the present specification, the terms "(numerical value) or more" and "(numerical value) or less" include the numbers.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An organic electroluminescent device comprising:
a structure in which an anode, an organic layer including a light-emitting layer, and a cathode are stacked on a substrate in this order; wherein
the light-emitting layer includes at least two different light-emitting materials;
a difference in photoluminescence peak wavelength between the at least two different light-emitting materials is about 50 nm or less; and
the at least two different light-emitting materials include an electron transport light-emitting material and a hole transport light-emitting material.

2. The organic electroluminescent device according to claim 1, wherein the at least two different light-emitting materials are fluorescent materials.

3. The organic electroluminescent device according to claim 1, wherein the at least two different light-emitting materials are phosphorescent materials.

4. An organic electroluminescent display device comprising the organic electroluminescent device of claim 1.

* * * * *